United States Patent [19]
Ryan

[11] Patent Number: 5,966,724
[45] Date of Patent: *Oct. 12, 1999

[54] SYNCHRONOUS MEMORY DEVICE WITH DUAL PAGE AND BURST MODE OPERATIONS

[75] Inventor: Kevin J. Ryan, Meridian, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/584,600

[22] Filed: Jan. 11, 1996

[51] Int. Cl.⁶ ....................................................... G11C 7/00
[52] U.S. Cl. ...................... 711/105; 365/189.01; 365/233
[58] Field of Search ..................................... 395/432, 425; 365/189.01, 189.02, 189.05, 222, 233, 193; 711/105

[56] References Cited

U.S. PATENT DOCUMENTS

| | | |
|---|---|---|
| 4,344,156 | 8/1982 | Eaton et al. .............................. 365/203 |
| 4,484,308 | 11/1984 | Lewandowski et al. ................ 364/900 |

(List continued on next page.)

FOREIGN PATENT DOCUMENTS 19507562 9/1995 Germany .

OTHER PUBLICATIONS

""DRAM 1 Meg × 4 DRAM 5VEDO Page Mode",", *1995 DRAM Data Book,,* pp. 1–1 thru 1–30,, (Micron Technology, I).

""Rossini, Pentium, PCI–ISA, Chip Set"", *Symphony Laboratories,,* entire book.

"4DRAM 1991", *Toshiba America Electronic Components, Inc.,* pp. A–137–A–159.

"Application Specific DRAM", Toshiba America Electronic Components, Inc., C178, C–260, C 218, (1994).

"Burst DRAM Function & Pinout", Oki Electric Ind., Co., Ltd., 2nd Presentation, Item ™ 619, (Sep. 1994).

"Hyper Page Mode DRAM", *8029 Electronic Engineering,* 66, No. 813, Woolwich, London, GB, pp. 47–48, (Sep. 1994).

"Mosel–Vitelic V53C8257H DRAM Specification Sheet, 20 pages, Jul. 2, 1994".

"Pipelined Burst DRAM", Toshiba, JEDEC JC 42.3 Hawaii, (Dec. 1994).

"Samsung Synchronous DRAM", *Samsung Electronics,* pp. 1–16, (Mar. 1993).

"Synchronous DRAM 2 MEG × 8 SDRAM", *Micron Semiconductor, Inc.,* pp. 2–43 through 2–8.

(List continued on next page.)

*Primary Examiner*—Eddie P. Chan
*Assistant Examiner*—Hong C. Kim
*Attorney, Agent, or Firm*—Schwegman, Lundberg, Woessner & Kluth, P.A.

[57] ABSTRACT

A synchronous burst access memory device fits in a standard Fast Page Mode DRAM package. The device is adapted to receive a free running system clock, a Byte Enable input (BE) and a Burst Control input (BC). The burst access memory device has an internal column address counter for burst accesses, but is capable of receiving a new column address with each clock edge in a page access to provide for random access of the memory. A data pipeline allows for high clock speeds and high data throughput. The state of the byte enable pin when the row address is latched determines whether a refresh cycle or a data access is to be performed. The BC input is also used to mask the clock input during row address strobe to column address strobe delay periods (tRCD). The clock input is used as a column address strobe after tRCD. A write enable input selects between read and write access cycles. The BC input determines whether the column address for the current cycle will be a new address latched from a source external to the memory device, or an internally generated address from the address counter.

9 Claims, 8 Drawing Sheets

U.S. PATENT DOCUMENTS

| | | | |
|---|---|---|---|
| 4,562,555 | 12/1985 | Ouchi et al. | 365/233 |
| 4,567,579 | 1/1986 | Patel et al. | 365/189 |
| 4,575,825 | 3/1986 | Ozaki et al. | 365/189 |
| 4,603,403 | 7/1986 | Toda | 365/189 |
| 4,618,947 | 10/1986 | Tran et al. | 365/230 |
| 4,649,522 | 3/1987 | Kirsch | 365/189 |
| 4,685,089 | 8/1987 | Patel et al. | 365/233 |
| 4,707,811 | 11/1987 | Takemae et al. | 365/239 |
| 4,788,667 | 11/1988 | Nakano | 365/193 |
| 4,870,622 | 9/1989 | Aria et al. | 365/230 |
| 4,875,192 | 10/1989 | Matsumoto | 365/193 |
| 5,058,066 | 10/1991 | Yu | 365/189.05 |
| 5,126,975 | 6/1992 | Handy et al. | 365/230 |
| 5,267,200 | 11/1993 | Tobita | 365/189 |
| 5,268,865 | 12/1993 | Takasugi | 365/189 |
| 5,280,594 | 1/1994 | Young et al. | 395/484 |
| 5,305,284 | 4/1994 | Iwase | 365/238.5 |
| 5,323,352 | 6/1994 | Miyata et al. | 365/222 |
| 5,325,330 | 6/1994 | Morgan | 365/189.05 |
| 5,325,502 | 6/1994 | McLaury | 395/425 |
| 5,349,566 | 9/1994 | Merritt et al. | 365/233.5 |
| 5,357,469 | 10/1994 | Sommer et al. | 365/193 |
| 5,373,227 | 12/1994 | Keeth | 323/313 |
| 5,379,261 | 1/1995 | Jones, Jr. | 365/230 |
| 5,392,239 | 2/1995 | Margulis et al. | 365/189.01 |
| 5,410,670 | 4/1995 | Hansen et al. | 395/425 |
| 5,452,261 | 9/1995 | Chung et al. | 365/233 |
| 5,457,659 | 10/1995 | Schaefer | 365/222 |
| 5,526,320 | 6/1996 | Zagar et al. | 365/233.5 |
| 5,598,376 | 1/1997 | Merritt et al. | 365/230.06 |
| 5,652,724 | 7/1997 | Manning | 365/233 |

OTHER PUBLICATIONS

Dave Bursky, "Novel I/O Options and Innovative Architectures Let DRAMs Achieve SRAM Performance; Fast DRAMs can be swapped for SRAM Caches", *Electronic Design,* vol. 41, No. 15, Cleveland, Ohio, pp. 55–67, (Jul. 22, 1993).

Shiva P. Gowni, et al., "A 9NS, 32K × 9, BICMOS TTL Synchronous Cache RAM With Burst Mode Access", *IEEE,* Custom Integrated Circuits Conference, pp. 781–786, (Mar. 3, 1992).

Steven. A. Przybylski, "New DRAM Technologies, A Comprehensive Analysis of the New Architectures", 1995, pp. 434–448, Micro Design Resoures.

Oki Electric, "Burst DRAM Function & Pinout, 128K×16/256K×16", Oki Electric Ind. Co., Ltd., Sep. 1994.

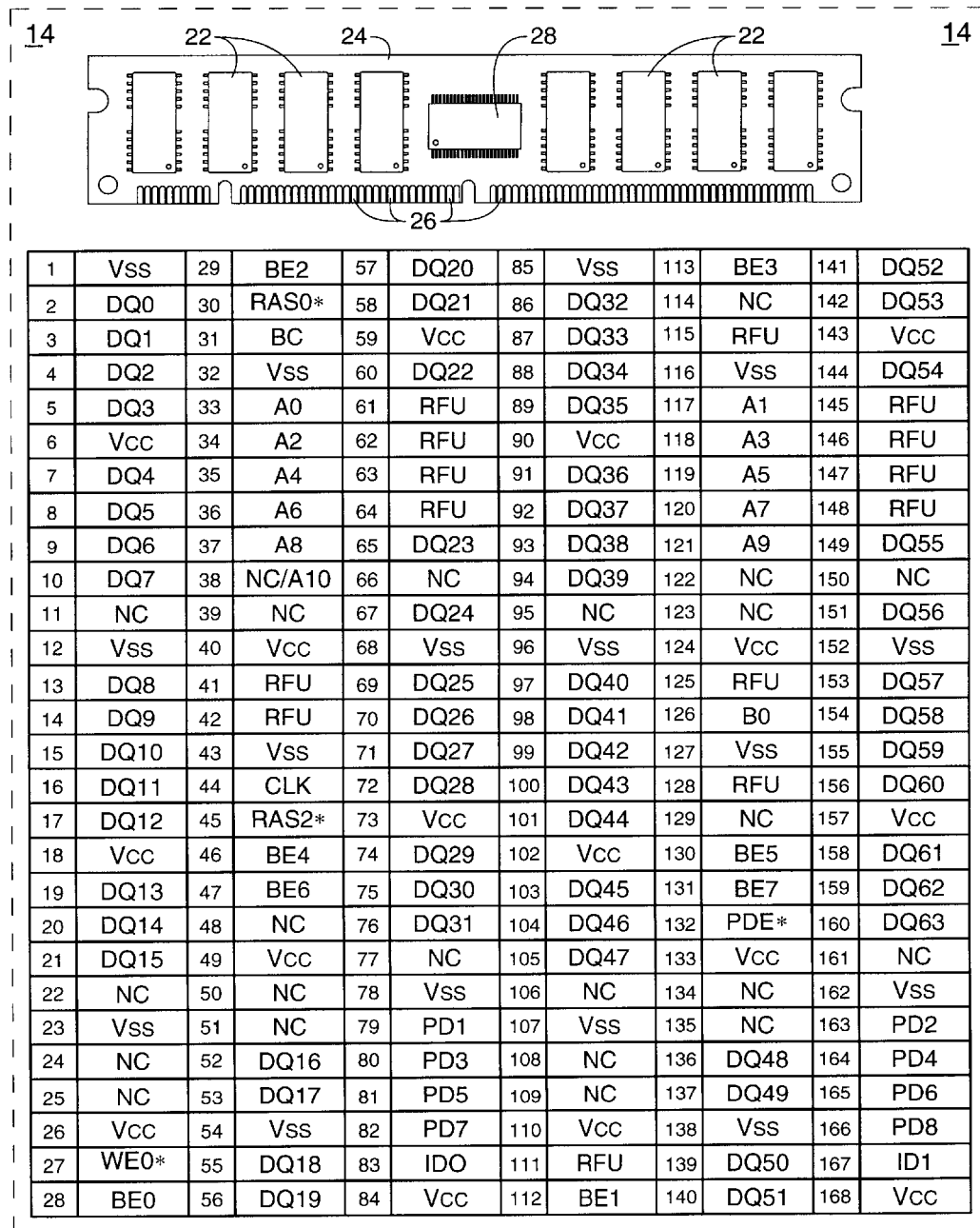

FIG. 3

| | | | | | | | | | | |
|---|---|---|---|---|---|---|---|---|---|---|
| 1 | Vss | 29 | BE2 | 57 | DQ20 | 85 | Vss | 113 | BE3 | 141 | DQ52 |
| 2 | DQ0 | 30 | RAS0* | 58 | DQ21 | 86 | DQ32 | 114 | NC | 142 | DQ53 |
| 3 | DQ1 | 31 | BC | 59 | Vcc | 87 | DQ33 | 115 | RFU | 143 | Vcc |
| 4 | DQ2 | 32 | Vss | 60 | DQ22 | 88 | DQ34 | 116 | Vss | 144 | DQ54 |
| 5 | DQ3 | 33 | A0 | 61 | RFU | 89 | DQ35 | 117 | A1 | 145 | RFU |
| 6 | Vcc | 34 | A2 | 62 | RFU | 90 | Vcc | 118 | A3 | 146 | RFU |
| 7 | DQ4 | 35 | A4 | 63 | RFU | 91 | DQ36 | 119 | A5 | 147 | RFU |
| 8 | DQ5 | 36 | A6 | 64 | RFU | 92 | DQ37 | 120 | A7 | 148 | RFU |
| 9 | DQ6 | 37 | A8 | 65 | DQ23 | 93 | DQ38 | 121 | A9 | 149 | DQ55 |
| 10 | DQ7 | 38 | NC/A10 | 66 | NC | 94 | DQ39 | 122 | NC | 150 | NC |
| 11 | NC | 39 | NC | 67 | DQ24 | 95 | NC | 123 | NC | 151 | DQ56 |
| 12 | Vss | 40 | Vcc | 68 | Vss | 96 | Vss | 124 | Vcc | 152 | Vss |
| 13 | DQ8 | 41 | RFU | 69 | DQ25 | 97 | DQ40 | 125 | RFU | 153 | DQ57 |
| 14 | DQ9 | 42 | RFU | 70 | DQ26 | 98 | DQ41 | 126 | B0 | 154 | DQ58 |
| 15 | DQ10 | 43 | Vss | 71 | DQ27 | 99 | DQ42 | 127 | Vss | 155 | DQ59 |
| 16 | DQ11 | 44 | CLK | 72 | DQ28 | 100 | DQ43 | 128 | RFU | 156 | DQ60 |
| 17 | DQ12 | 45 | RAS2* | 73 | Vcc | 101 | DQ44 | 129 | NC | 157 | Vcc |
| 18 | Vcc | 46 | BE4 | 74 | DQ29 | 102 | Vcc | 130 | BE5 | 158 | DQ61 |
| 19 | DQ13 | 47 | BE6 | 75 | DQ30 | 103 | DQ45 | 131 | BE7 | 159 | DQ62 |
| 20 | DQ14 | 48 | NC | 76 | DQ31 | 104 | DQ46 | 132 | PDE* | 160 | DQ63 |
| 21 | DQ15 | 49 | Vcc | 77 | NC | 105 | DQ47 | 133 | Vcc | 161 | NC |
| 22 | NC | 50 | NC | 78 | Vss | 106 | NC | 134 | NC | 162 | Vss |
| 23 | Vss | 51 | NC | 79 | PD1 | 107 | Vss | 135 | NC | 163 | PD2 |
| 24 | NC | 52 | DQ16 | 80 | PD3 | 108 | NC | 136 | DQ48 | 164 | PD4 |
| 25 | NC | 53 | DQ17 | 81 | PD5 | 109 | NC | 137 | DQ49 | 165 | PD6 |
| 26 | Vcc | 54 | Vss | 82 | PD7 | 110 | Vcc | 138 | Vss | 166 | PD8 |
| 27 | WE0* | 55 | DQ18 | 83 | ID0 | 111 | RFU | 139 | DQ50 | 167 | ID1 |
| 28 | BE0 | 56 | DQ19 | 84 | Vcc | 112 | BE1 | 140 | DQ51 | 168 | Vcc |

SYNCHRONOUS MEMORY DEVICE WITH DUAL PAGE AND BURST MODE OPERATIONS

FIELD OF THE INVENTION

This invention relates to memory device architectures designed to provide high density data storage with high speed read and write access cycles. This invention is particularly applicable to Dynamic Random Access Memory devices (DRAMs) which have a synchronous burst access mode of operation.

BACKGROUND OF THE INVENTION

Fast Page Mode DRAMs are among the most popular integrated circuit memory devices in use today. In fast page mode operation, a row address strobe (/RAS) is used to latch a row address portion of a multiplexed DRAM address. Multiple occurrences of the column address strobe (/CAS) are then each used to latch a new column address to access data within the selected row at the specified column location. Fast Page Mode DRAMs are said to be "Random Access" memory devices because a new address can be specified for each access cycle in a random order within an open page or row. In a read access, the falling edge of /CAS is used to latch a column address and to enable the DRAM outputs to drive selected data from the DRAM. When /CAS transitions high the DRAM outputs are placed in a high impedance state (tristate). As cycle times shorten, the period of time that data is valid at the outputs of a Fast Page Mode DRAM limits the usefulness of this mode of operation. For example, if the data valid time from /CAS precharge (tCPA) is thirty five nanoseconds, the minimum /CAS cycle time tPC is thirty five nanoseconds and the minimum /CAS high to data invalid time tOFF is three nanoseconds, then data is only guaranteed to be valid for three nanoseconds per cycle when operating at a maximum /CAS frequency of twenty eight megahertz.

Numerous alternatives to the standard DRAM architecture have been proposed in an effort to attain higher frequency data access cycles. Extended Data Out (EDO) DRAMs provide a longer period of time when data is valid at the outputs of a DRAM in a page mode cycle. In an EDO DRAM the data lines are not tristated between read cycles in a page mode operation. Instead, data is held valid after /CAS goes high until sometime after the next /CAS low transition occurs, or until /RAS or the output enable (/OE) goes high. By providing a wider data valid time window, the device cycle times can be decreased. Determining when valid data will arrive at the outputs of a fast page mode or EDO DRAM can be a complex function of when the column address inputs are valid, when /CAS falls, the state of /OE and when /CAS rose in the previous cycle. The period during which data is valid with respect to the control line signals (especially /CAS) is determined by the specific implementation of the EDO mode, as adopted by the various DRAM manufacturers.

Other methods to shorten memory access cycles tend to require additional circuitry, additional control pins and non-standard device pinouts. The proposed industry standard synchronous DRAM (SDRAM) for example, in addition to /RAS, /CAS, /WE and /CS, has an additional pin for receiving a system clock signal. SDRAMs also have a clock enable pin, a bank address and a data mask pin. Also, the /RAS, /CAS, /WE and /CS signals of a SDRAM have dramatically different timing requirements and perform different functions than signals with similar names which are found on page mode DRAMs. The addition of several control pins has required a deviation in device pinout from standard DRAMs which further complicates design efforts to utilize these new devices. Significant amounts of additional circuitry are required in the SDRAM devices which in turn result in higher device manufacturing costs.

SUMMARY OF THE INVENTION

An integrated circuit memory device is designed for high speed data access. A high speed burst mode of operation is provided where multiple sequential accesses occur following a single column address, and data is input and output relative to a clock signal (CLK). In the burst mode of operation the address is incremented internal to the device eliminating the need for external address lines to switch at high frequencies. Read/Write commands are issued once per burst access eliminating the need to toggle the Read/Write control line at high speeds. Internal circuitry of the memory device is largely compatible with existing Burst Extended Data Out (Burst EDO) DRAMs. This similarity allows the two part types to be manufactured on one die with a limited amount of additional circuitry. A Burst Control input signal BC allows the device to receive a random column address in a nonburst type mode. The ability to switch between a random column non-burst mode and a high speed burst mode allows the device to be used in applications where page mode devices are preferred for some or all access cycles, and eliminates the need to switch to more complex high speed memory devices to attain the high data rates of a burst access device. Operating frequencies above 66 megahertz are possible with this architecture due to internal address generation, pipelined read circuitry, an extended valid data output period and synchronous operation. A preferred device pinout replaces the /CAS, /OE and the No Connect (NC) inputs of a standard page mode DRAM with CLK, BE and BC respectively. No additional pins are required. This combination of features allows for significant system performance improvements with a minimum of design alterations.

BRIEF DESCRIPTION OF THE DRAWINGS

The features of the invention as well as objects and advantages will be best understood by reference to the appended claims, detailed description of particular embodiments and accompanying drawings where:

FIG. 3 is a top view of an exemplary memory module in accordance with the invention;

DETAILED DESCRIPTION OF THE PREFERRED EMBODIMENTS

Figure 1:
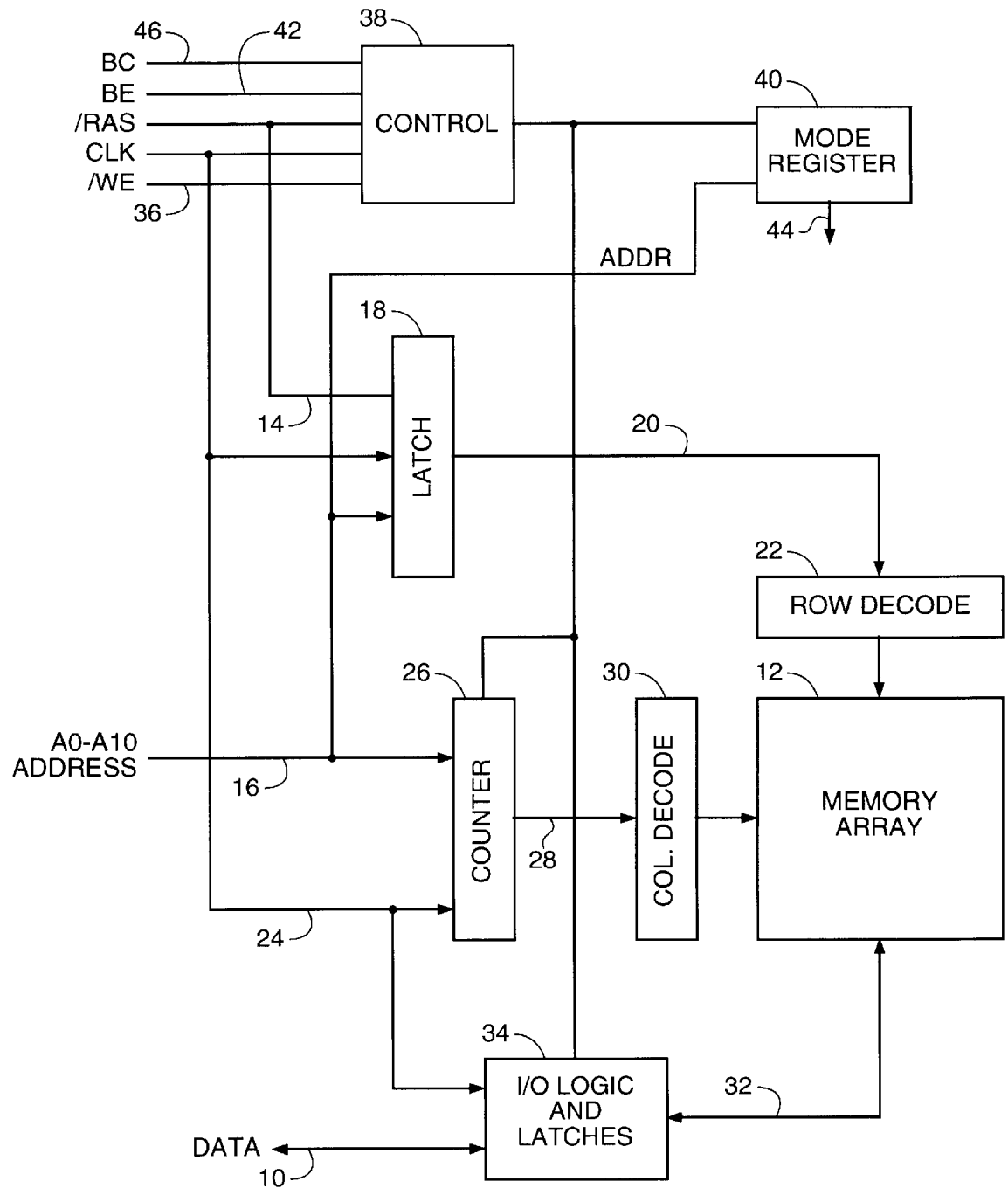
FIG. 1 is an electrical schematic diagram of an exemplary memory device in accordance with one embodiment of the invention.

FIG. 1 is a schematic representation of a sixteen megabit device designed in accordance with the present invention.

The device is organized as a 2 Meg×8 Burst Access DRAM having an eight bit data input/output path 10 providing data storage for 2,097,152 bytes of information in the memory array 12. The device of FIG. 1 fits in an industry standard package for eight bit wide DRAMs. An active-low row address strobe (/RAS) signal 14 is used to latch a first portion of a multiplexed memory address, from address inputs A0 through A10 16, in latch 18. The row address may be latched on the falling edge of /RAS itself (asynchronous /RAS), or it may by latched by the CLK input after /RAS is low (synchronous /RAS). For the purposes of this specification, the term input may be, but is not limited to, an input signal or a point in a circuit for receiving an input signal. The latched row address 20 is decoded in row decoder 22. The decoded row address is used to select a row of the memory array 12. A free running (CLK) signal 24 is used to latch a second portion of a memory address from address inputs 16 into column address counter 26 when the burst control input (BC) 46 is high. The latched column address 28 is decoded in column address decoder 30. The decoded column address is used to select a column of the memory array 12.

In a burst read cycle, data within the memory array located at the row and column address selected by the row and column address decoders is read out of the memory array and sent along data path 32 to output latches 34. Data 10 driven from the Burst Access DRAM may be latched external to the device in synchronization with CLK after a predetermined number of CLK cycle delays (latency). For a two cycle latency design, a first CLK rising edge is used to latch an initial column address for a burst access. The first burst data from the memory may be latched in an intermediate latch shortly after it becomes valid on internal data lines. The data from the intermediate data latch is then latched in the output latch and driven from the memory after the second CLK rising edge, and remains valid through the third CLK rising edge. Latching the data in an intermediate latch allows for access cycles to begin immediately after each CLK low to high transition. Once the memory device begins to output data in a burst read cycle, a new data value may be present at the output of the device following each CLK rising edge dependent on the state of the byte enable (BE) control line. Each data value may be valid for nearly one CLK cycle. Once a row and a column address are selected, additional transitions of the CLK signal are used to advance the column address within the column address counter in a predetermined sequence while BC is low. The time at which data will be valid at the outputs of the Burst Access DRAM is dependent only on the timing of the CLK signal provided that BE is maintained high in a read cycle. The output data signal levels may be driven in accordance with, but not limited to, standard CMOS, TTL, LVTTL, GTL, or HSTL output level specifications.

The address may be advanced linearly, or in an interleaved fashion for maximum compatibility with the overall system requirements. The column address may be advanced with each CLK transition, each rising edge, each falling edge, or for a multiple of CLK periods in the event that more than one data word is read from the array with each column address. When the address is advanced with each transition of the CLK signal, data is also latched in the intermediate latch, latched in the output latch and driven from the part after each /CAS transition. In this case, the device latency is referenced to each edge of the CLK signal. It may be desirable to latch and increment the column address after the first CLK rising edge in order to apply both the latched and incremented addresses to the array at the earliest opportunity in an access cycle.

A device designed in accordance with the present invention may perform accesses to two array addresses per cycle (prefetch architecture). The memory array for a prefetch architecture device may be split into odd and even array halves. The column address least significant bit is then used to select between odd and even halves while the other column address bits select a column within each of the array halves. In an interleaved access mode with column address 1, data from columns 0 and 1 would be read and the data from column 1 would be output followed by the data from column 0 in accordance with standard interleaved addressing as described in SDRAM specifications. In a linear access mode column address 1 would be applied to the odd array half, and incremented to address 2 for accessing the even array half to fulfill the two word access. Prefetch architectures where more than two data words are accessed are also possible.

In a preferred embodiment, accesses are performed in response to rising edges of the CLK signal. In a burst access an initial column address is latched from address input 16 on a rising edge of CLK after BC transitions high. If BC remains high, additional column addresses are latched with each CLK rising edge and accesses are performed in a pipelined EDO page mode fashion with random column addressing allowed. If BC transitions low, additional burst column addresses are generated in the column address counter. Column addresses from the column address counter are decoded and used to access additional locations within the memory array without the requirement of column addresses being supplied on address input 16. This burst sequence will continue for each CLK rising edge until a predetermined number of access cycles equal to the burst length have occurred as long as the BC input remains low. If BC remains low beyond the burst access length, the device will tristate the data outputs, and ignore any input data. A CLK rising edge received after the last burst address has been generated will latch another column address from the address inputs 16 if BC is high. In a burst read access, data is latched in the output latch and driven from the device with each rising edge of CLK after the first CLK latency while BE is high. If BE is low when CLK rises, the data associated with that memory cycle will be tristated. The latency from BE to data output tristate corresponds with the read data latency. Other BE to tristate data delays are possible. BE could have asynchronous control over the output drivers, or could have a fixed latency of one or two clock cycles for example. After the row address is latched in an access cycle, BE may become a "don't care" until BC transitions high to allow the first column address to be latched. In this case the outputs will remain tristate despite the state of BE until the first column address is latched and the first latency period has expired. Alternatively, BE may directly control the output even before a column address is latched. In this second case, invalid data may appear on the device outputs if BE transitions high in a clock cycle prior to BC transitioning high.

A preferred embodiment of a sixteen bit wide Burst Access DRAM designed in accordance with the teachings of this invention has two BE input pins BEH and BEL. Only one of the BE signals needs to be low when the row address is latched to specify an access cycle over a refresh cycle. The second BE signal may remain high. During burst read cycles, all sixteen data bits may be driven out of the part during a read cycle even if one BE remains inactive. In a typical system application, a microprocessor reads all data bits on a data bus in each read cycle, but may only write certain bytes of data in a write cycle. Alternately, each BE may control a byte width of the data output drivers and data drivers associated with a low BE signal may be placed in a tristate condition even if the other BE signal is high. For burst write access cycles, each of the BE signals (BEH and BEL) acts as a write enable for an eight bit width of the data. If only one BE signal is high for a given write cycle, then the eight bits of data associated with the BE that remained low are not stored in the memory.

For a burst write cycle, data 10 is latched in input data latches 34. Data targeted at the first address specified by the row and column addresses is latched with the CLK signal when the first column address is latched (write cycle data latency is zero). Other write cycle data latency values are possible; however, for today's memory systems, zero is preferred. Additional input data words for storage at incremented column address locations are latched on successive CLK rising edges. Input data from the input latches 34 is passed along data path 32 to the memory array where it is stored at the location selected by the row and column address decoders. As in the burst read cycle previously described, a predetermined number of burst access writes will occur without the requirement of additional column addresses being provided on the address lines 16 if BC goes low after an initial address is latched. After the predetermined number of burst writes has occurred, input data will be ignored if BC remains low. If BC transitions back high, a new column address will be latched and another burst access will be enabled when BC transitions low.

In a preferred embodiment of the invention, the /WE pin is used to select between read and write accesses of the memory each time a new column address is latched (BC high). Within a burst access the /WE pin can be a "don't care" as long as BC remains low. In other words, a preferred embodiment of the invention does not allow for both read and write cycles within a burst access, so the /WE signal may be latched by CLK rising when BC is high.

DRAM control circuitry 38, in addition to performing standard DRAM control functions, controls the I/O circuitry 34 and the column address counter/latch 26 in accordance with the /RAS, BE, BC and /WE control signals. Among other functions, control circuit 38 enables counter 26 to load an initial address in response to the CLK signal when BC is high and /RAS is active. Control circuit 38 also enables and disables data path logic 34 within a burst access based on the state of the BE signal. Control circuitry 38 may contain a burst counter which counts the number of accesses in a burst access and terminates the burst access when the number of accesses reaches a predetermined number. In an alternate embodiment, the burst counter is replaced by an initial address latch and a comparator which compares the least significant bits of the initial address with internally generated addresses and terminates the burst access when a match occurs.

A preferred implementation of the device of FIG. 1 includes a fixed burst length of 4, a fixed read data latency of 2 CLK cycles and a fixed interleaved sequence of burst addresses. This basic implementation requires very little additional circuitry over the standard EDO page mode DRAM, and may be mass produced on a common die with EDO or Burst EDO DRAMs.

Programmability of the burst length, read data latency and address sequences may be accomplished through the use of a mode register 40 which latches the state of one or more of the address input signals 16 or data signals 10 upon receipt of a programming cycle. Up to four possible cycle types may be defined by BC and /WE with BE high at /RAS falling time. One or more of these four combinations may be defined as a programming cycle. In such a device, outputs 44 from the mode register control the required circuits on the DRAM. Burst length options of 2, 4, 8 and full page as well as read data latencies of 2 or 3 may be provided. For a latencies of 3, an additional pipeline stage may be added. It may be desirable to place this additional pipeline stage in the address path, or in the read data path between the memory array and the first intermediate data latch. Other burst length and latency options may be provided as the operating speeds of the device increase, and computer architectures evolve. The device of FIG. 1 includes programmability of the address sequence by latching the state of the least significant address bit during a programming cycle. The burst length and read data latency for this particular embodiment are fixed. Other possible alterations in the feature sets of this DRAM include multiple modes of operation selectable by wire bond options, or programmable fuses which may be used to program the mode of operation of the device. Possible modes of operation include but are not limited to standard EDO DRAM, Fast Page Mode DRAM, Burst EDO DRAM modes of operation. For these alternate modes of operation, the selection of the mode will redefine the input signals to /CAS, /OE and NC from CLK, BE and BC respectively.

The present invention has been described with reference to several preferred embodiments. Just as fast page mode DRAMs and EDO DRAMs are available in numerous configurations including ×1, ×4, ×8 and ×16 data widths, and 1 Megabit, 4 Megabit, 16 Megabit and 64 Megabit densities; the memory device of the present invention may take the form of many different memory organizations. It is believed that one who is skilled in the art of integrated circuit memory design can, with the aide of this specification design a variety of memory devices which do not depart from the spirit of this invention. It is therefore believed that detailed descriptions of the various memory device organizations applicable to this invention are not necessary.

Figure 2:
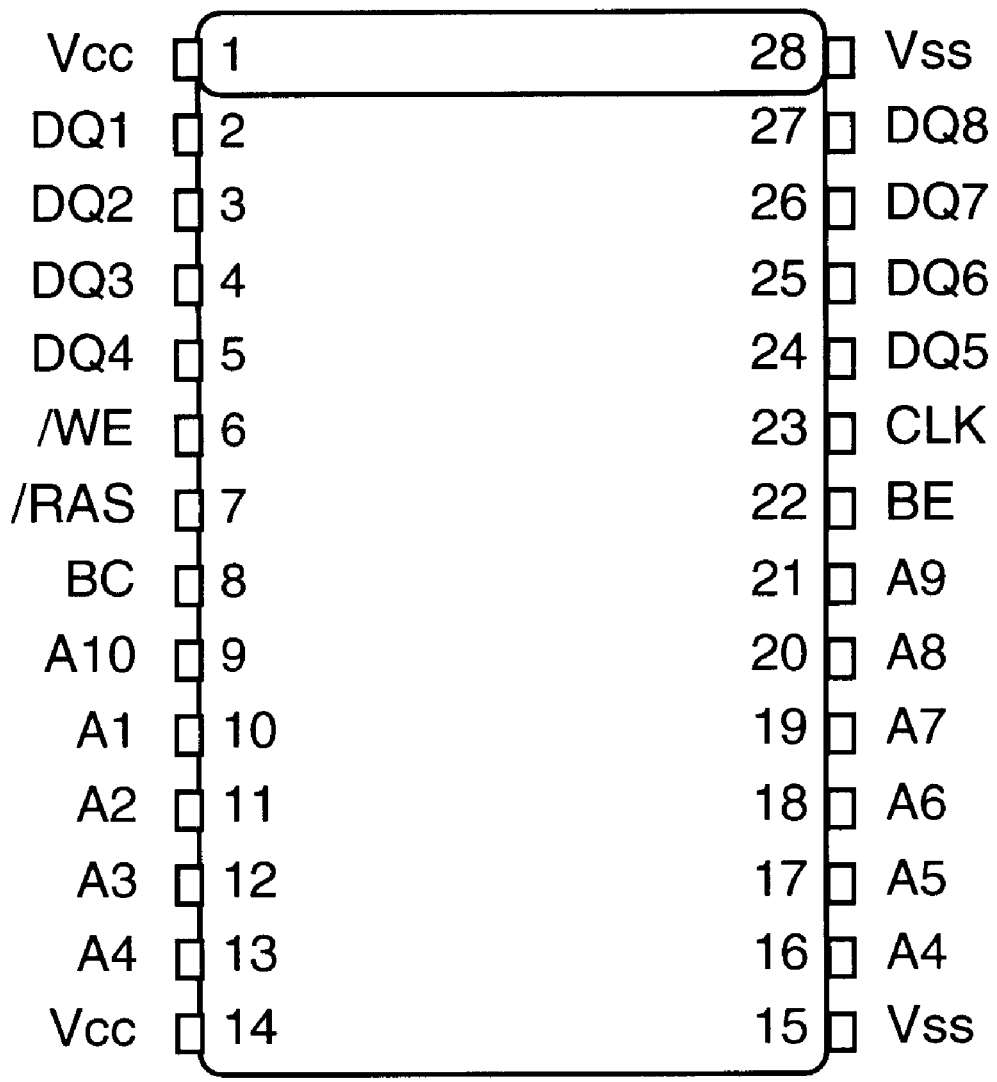
FIG. 2 shows a preferred pinout for the device of FIG. 1.

FIG. 2 shows a preferred pinout for the device of FIG. 1. It should be noted that the package for this new burst access memory device may be identical to the package for a standard EDO DRAM. Other pinouts are possible, but a common package allows this new device to be used in existing memory designs with minimum design changes. A standard page mode DRAM will have /CAS, /OE and NC in place of CLK, BE and BC respectively. Memory devices with different organizations and memory densities may require alternate packages and pinouts. The pinout shown in FIG. 2 is exemplary of how a standard DRAM package can be utilized for the inventive Burst Access Memory device.

FIG. 3 is a top view of a memory module utilizing the device of FIG. 1. FIG. 3 is a Dual In Line Memory Module (DIMM). Other module types may be used such as, but not limited to, Single In Line Memory Modules (SIMMs), Multi Chip Modules (MCMs), etc. The memory module of FIG. 3 is one example of an apparatus designed in accordance with the present invention. The burst access memory device of the present invention may be utilized in many other types of apparatus including, but not limited to, computers, communication equipment, printers, digital television sets, etc.

Figure 4:
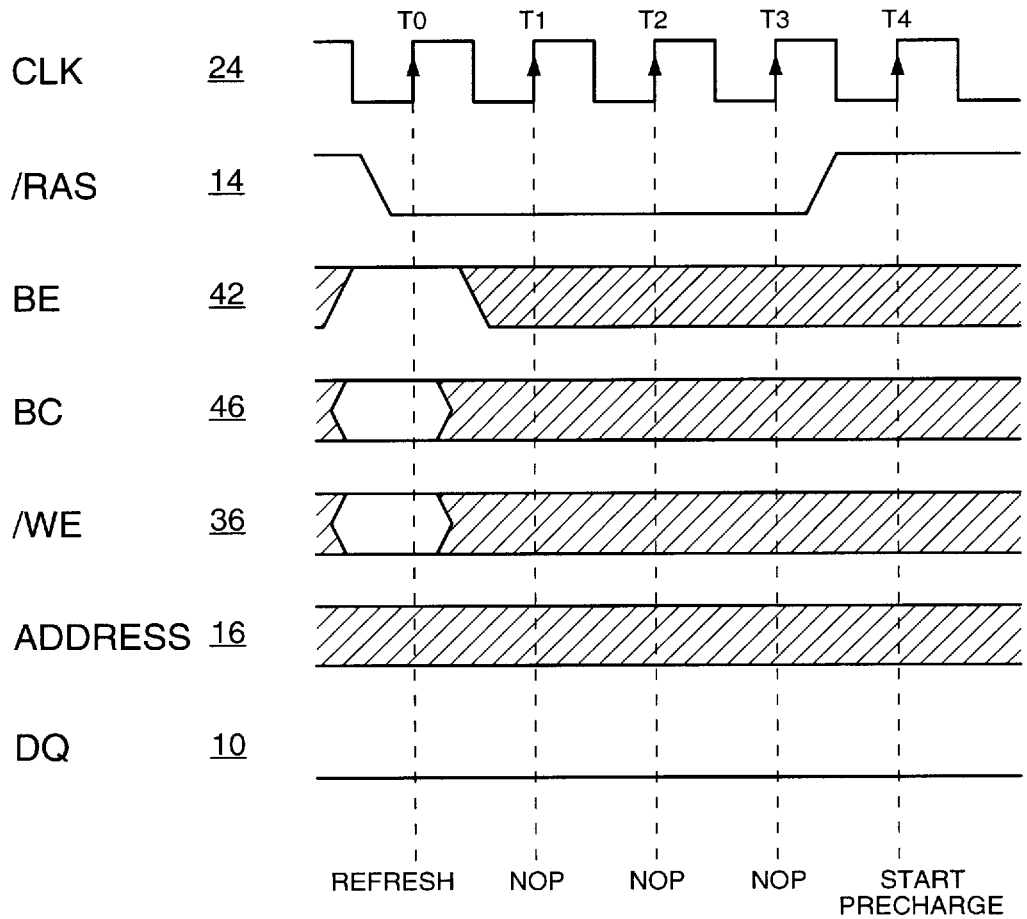
FIG. 4 is a first timing diagram for operation of the device of FIG. 1.

FIG. 4 is a timing diagram of a refresh cycle for the Burst Access Memory device of FIG. 1. Referring also to FIG. 1, a refresh cycle may be performed without initiating a memory access by bringing the /RAS signal 14 low while BE 42 is high. This is shown at time 100. If /RAS is latched on the first CLK 24 rising edge after /RAS falls (time 110), then the BE signal may go high after /RAS falls as long as it is high in time to meet a minimum BE to CLK setup time. A combination of the /WE 36 and BC 46 signals may be used in combination with BE high to program the memory device by latching the states of selected address 16 and/or data 10 signals in mode register 40. It may be desirable to have a programming mode (/WE low and BE high at /RAS falling for example) in which a refresh cycle is not performed. If a refresh cycle is not performed in a programming cycle, then the /RAS low time for the programming cycle can be very short and will not require an additional /RAS precharge period prior to performing an access cycle. One embodiment may utilize the /WE input for example to specify a programming cycle, and the BC input may then be utilized to differentiate between a programming cycle where a refresh cycle is or is not performed. Latch circuit 18 of FIG. 1 may include a counter for generating refresh addresses. One combination of the /WE and BC signals may be used to select between an internal (18) and an external (Address 16) source of the row address 20 for refreshing a row of the array 12. For example, in the embodiment where /WE and BC selects a programming cycle and refresh, the refresh address may be from an internal source to allow programming data to be carried on the external address lines. When /WE selects refresh without a programming cycle, the BC signal may select between an internal and an external refresh address source. Additional modes of operation may be decoded according to address and/or data inputs when /RAS falls or is latched low while BE is high. An address and/or data combination may be used to specify a self refresh mode of operation. Alternately, one of the four combinations of /WE and BC may be used to enter self refresh mode. Once entered, self refresh mode could remain active while /RAS is low, or until another mode cycle terminates self refresh mode.

Figure 5:
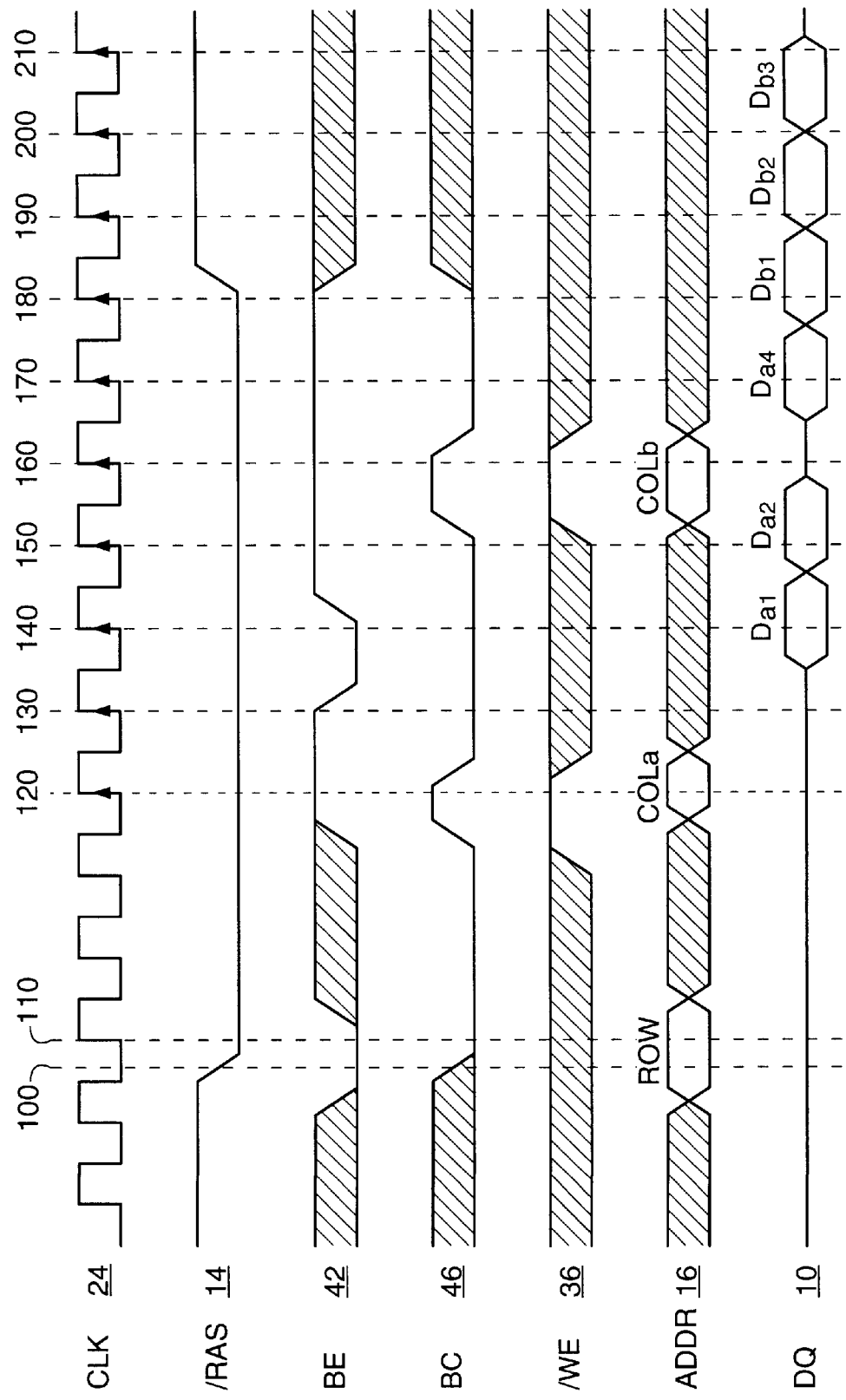
FIG. 5 is a second timing diagram for operation of the device of FIG. 1.

FIG. 5 is a timing diagram of a burst read access cycle which is interrupted by a second burst read access and then terminated by /RAS transitioning high. A period of tristated data output is also shown. With reference to FIG. 1, signal 14 falls to latch a first portion of a memory address from address input 16 into latch 18 at time 100 for an asynchronous /RAS design, or at time 110 for a synchronous /RAS design. Since input signal 42 (BE) is low at time 100, a memory access is enabled. At time 120, a second portion of the memory is latched into column address circuit 26 from address input 16 in response to a high level on signal 46 (BC) when signal 24 (CLK) transitions high. A high level on input signal 36 (/WE) specifies a read access. Signal 46 transitions low prior to the next rising edge of signal 24 enabling column address circuit 26 to provide an internally generated column address to column address decode circuit 30. Input signal 36 may be latched at time 120 in control circuit 38 in which case it becomes a don't care for the remainder of the burst read access. At times 130, 140 and 150 burst access read cycles are performed with column addresses generated in column address circuit 26. The internally generated addresses are preferably generated in response to falling edges of signal 24 and applied to the memory array 12 through decoder 30 in response to rising edges of signal 24. The example of FIG. 5 shows a read data latency of two clock cycles from the input of a column address until data from the input column address may be sampled at the memory device outputs by a rising edge of signal 24 at time 140. Read data from the first internally generated column address is available after a two cycle latency (time 150) from when this column address is used to access the array at time 130. Data from a second internally generated address, which may be used to access the array beginning at time 140, is not driven from the memory device at time 160 because the input signal 42 is low at time 140 indicating that the data outputs of the memory device should be tristate at time 160. At time 160 input signal 46 is high when signal 24 transitions from high to low causing a new column address to be loaded from input 16 into circuit 26. Data from a third internally generated address which is used to access the array at time 150 is available at the device outputs at time 170 since the input signal 42 is high at time 150. At time 180 two cycles of input signal 24 have passed since the second external column address was latched into circuit 26, and data associated with the second externally loaded column address is available at the device outputs. Internally generated addresses are used to access the array at times 170 and 180 and associated data is available at the device outputs at times 190 and 200. At time 190 input signal 14 is high, so no new access is begun, and the burst sequence is terminated after only three access cycles. Data continues to be output from the device until after time 200 when the last data associated with a memory access (begun at time 180) is valid at the device outputs. It should be noted from FIG. 5 that a constant stream of data from sequential burst access cycles can be generated from the Burst Access Memory device. If the input signal 46 remained low through time 160, then the burst would have terminated (for a predetermined burst length of four), and the data outputs would have gone into a tristate condition prior to time 180 despite continued cycles of input signal 24 and the high level of input signal 42.

Figure 6:
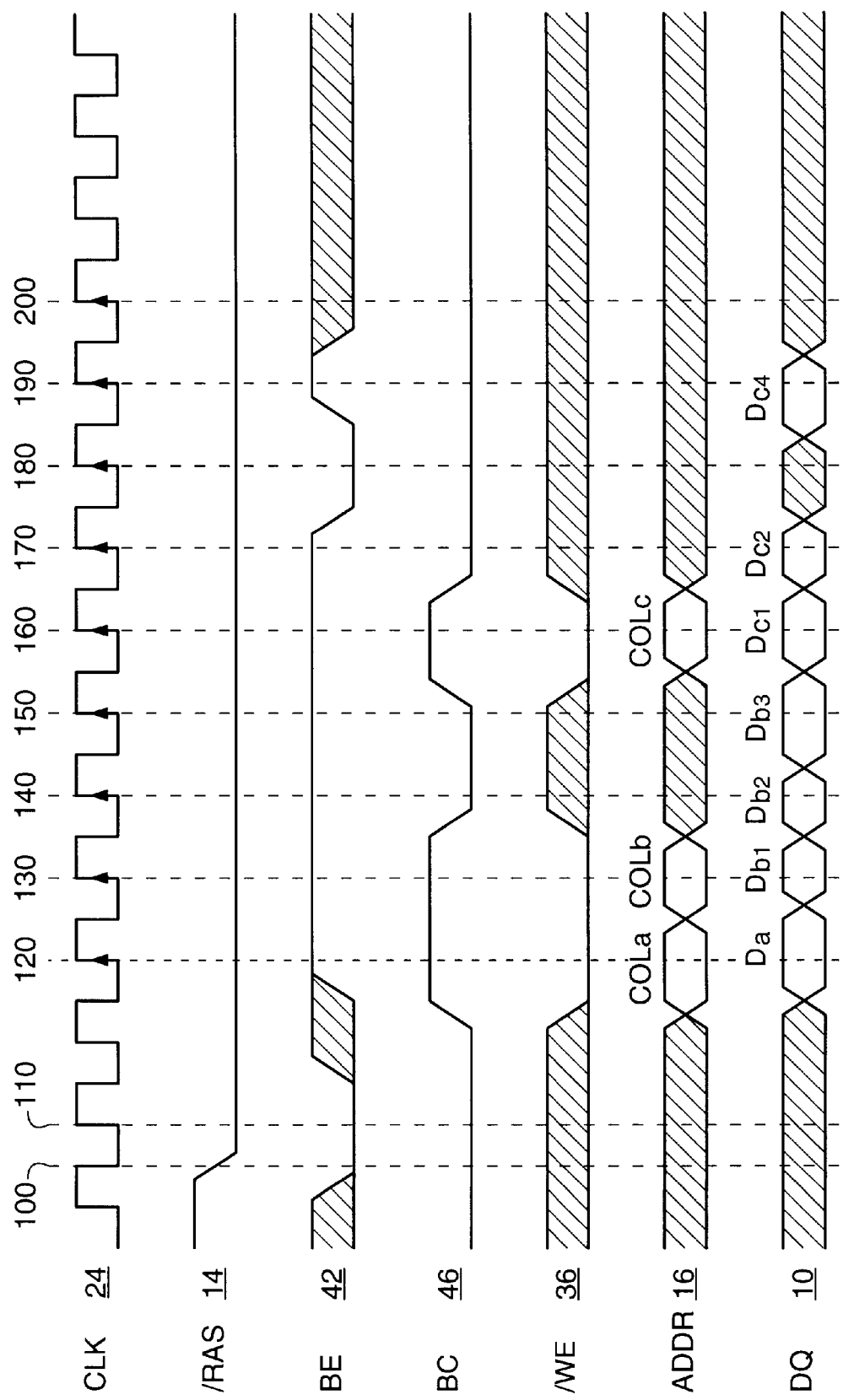
FIG. 6 is a third timing diagram for operation of the device of FIG. 1.

FIG. 6 is a timing diagram of a random column address write cycle which is followed by a burst write cycle, then interrupted by a second burst write which is terminated after the burst length has been reached. A period in which data is masked is also shown. With reference to FIG. 1, signal 14 falls to latch a first portion of a memory address from address input 16 into latch 18 at time 100 for an asynchronous /RAS design, or at time 110 for a synchronous /RAS design. Since input signal 42 (BE) is low at time 100, a memory access is enabled. At time 120, a second portion of the memory is latched into column address circuit 26 from address input 16 in response to a high level on signal 46 (BC) when signal 24 (CLK) transitions high. A low level on input signal 36 (/WE) specifies a write access. Data from inputs 10 is latched at time 120 and is written in the memory array 12 at the address specified by the first portion latched at time 100 or 110 and the second portion latched at time 120. Since BC remains high through time 130, a new second portion of the address is latched from inputs 16 at time 130. Data from inputs 10 at time 130 is written to the address specified by the first portion and the new second portion. BC is low at time 140, so the memory device generates a new second portion address internally in circuit 26 based on the initial burst address latched at time 130 in a predetermined address sequence. Internally generated burst addresses are used to specify addresses for storing data received at times 140 and 150 since the BC input remains low. At time 160 BC is high, and a new initial burst address is latched in circuit 26. Also at time 160, data is latched and a write cycle is begun. At time 170 an internally generated address is used to specify an address to store associated write data which is latched at time 170. At time 180 since the BE signal is low, the data on inputs 10 is not written into the array (input data is masked). For a device with multiple BE signals, data associated with a high BE signal may be written while data associated with a low BE signal is masked. The second portion of the address is advanced at time 180 regardless of whether or not data is written. At time 190, the fourth burst write cycle is begun with an internally generated address. At time 200, the burst is complete and input signals 42 and 10 become don't cares.

Figure 7:
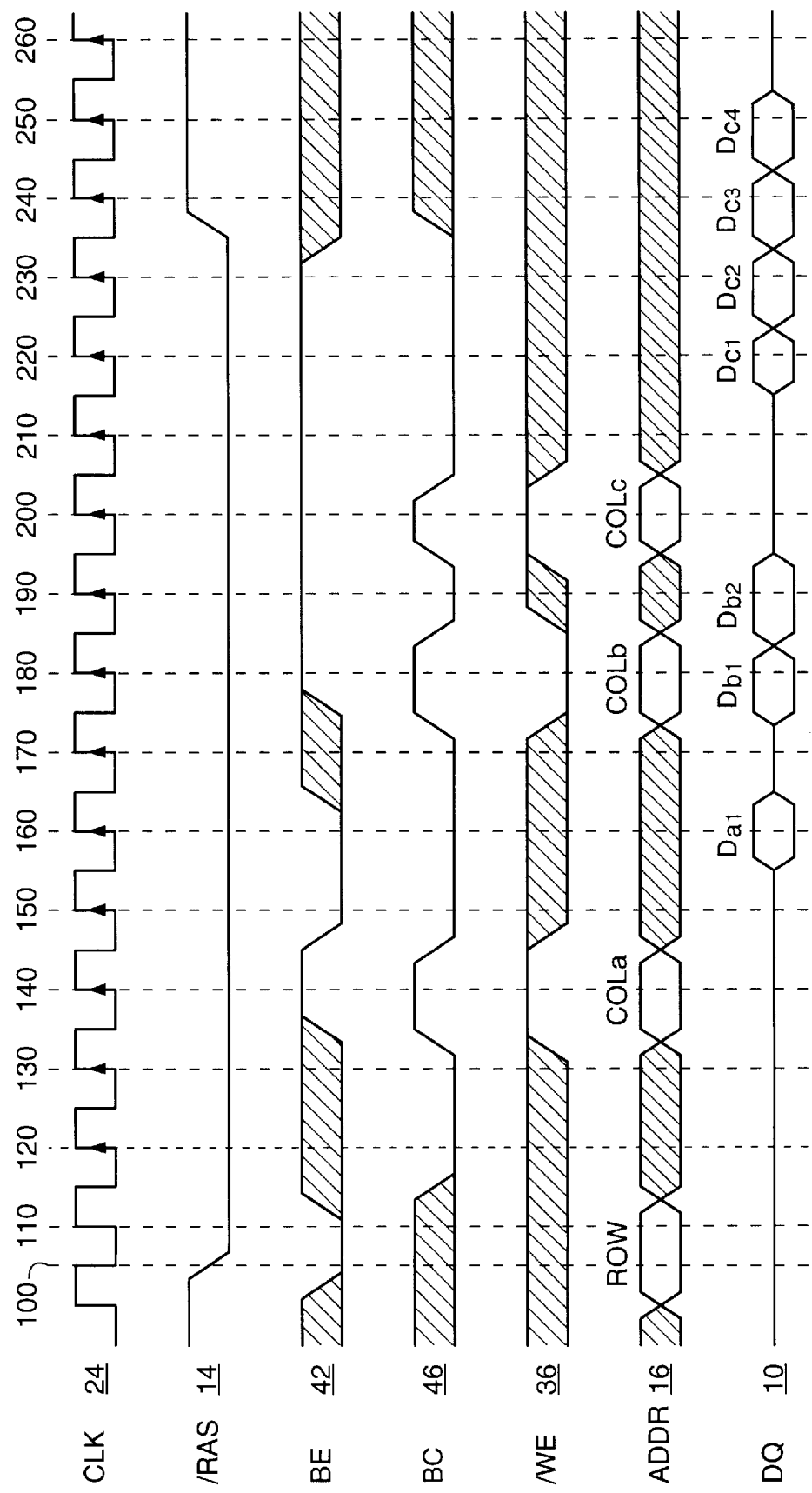
FIG. 7 is a fourth timing diagram for operation of the device of FIG. 1.

FIG. 7 is a timing diagram of a burst read access cycle followed by a burst write access cycle which is then followed by a second burst read access cycle. With reference to FIG. 1, signal 14 falls to latch a first portion of a memory address from address input 16 into latch 18 at time 100 for an asynchronous /RAS design, or at time 110 for a synchronous /RAS design. Since input signal 42 (BE) is low at time 100, a memory access is enabled. At time 140, a second portion of the memory is latched into column address circuit 26 from address input 16 in response to a high level on signal 46 (BC) when signal 24 (CLK) transitions high. A high level on input signal 36 (/WE) specifies a read access. At time 160 the first data from the burst read access initiated at time 140 is available at the device outputs 10. With a latency of two clock cycles, the low on signal 42 at time 150 will cause data outputs 10 to tristate prior to time 170. The period of tristated data out allows for upcoming write data to be driven on the data inputs 10 for a write command at time 180. Since input 46 is low at time 190, a second data input for an internally generated address is latched. At time 200, a second burst read access is initiated. At time 230 the last read cycle of the second burst read access is begun. Input signal 14 is allowed to transition high after time 230. The burst read data from the memory device continues to be driven on outputs 10 through time 250 corresponding to a latency of two cycles from the beginning of the last read cycle at time 230. At time 260 the data outputs are placed in a high impedance state.

Figure 8:
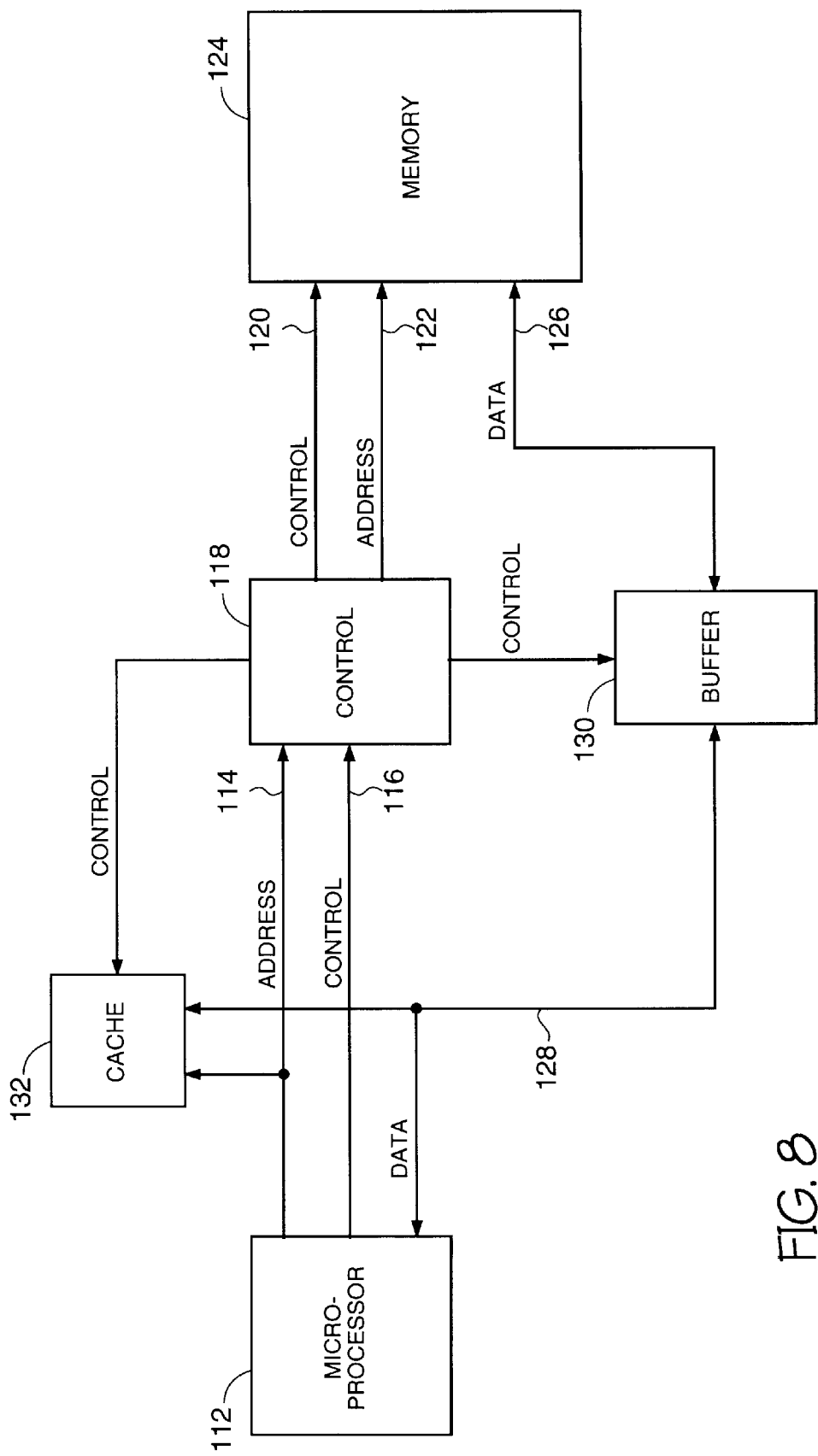
FIG. 8 is a block schematic diagram of an exemplary system in accordance with the invention.

FIG. 8 is a schematic representation of an apparatus designed in accordance with the present invention. For the purposes of this specification a microprocessor may be, but is not limited to, a microprocessor, a microcontroller, a digital signal processor, or an arithmetic processor. In FIG. 11, microprocessor 112 is connected via address lines 114 and control lines 116 to a memory control circuit 118. The memory control circuit provides address and control signals on lines 122 and 120 respectively to a burst access memory device 124. The burst access memory device sends and receives data over data bus 126. Optional data bus buffer 130 between memory data bus 126 and microprocessor data bus 128 allows for amplification of the data signals, and/or synchronization with the microprocessor and memory control signals. A fast static random access memory (SRAM) cache circuit 132 is also optional and provides higher speed access to data stored in the cache from the memory circuit or the microprocessor. Memory control circuit 118 may be incorporated within the microprocessor. The memory control circuit provides the required address strobe and clock signals, address signals and read/write control signals required for burst mode access of the memory circuit. The capability of the processor to access the memory in a burst mode allows for the design of a computer with relatively high memory bandwidth without the requirement of a fast SRAM cache. SRAMs which are fast enough to provide memory access without wait states can significantly add to the cost of a computer. Thus the burst access memory device of the present invention allows for medium to high performance computers to be manufactured at a cost which is significantly less than those manufactured today. Use of the burst access memory device of the present invention in cooperation with a fast SRAM cache allows for an even higher performance computer design by providing fast burst access of main memory in the event of a cache miss.

In operation, the microprocessor reads data from the memory device by supplying address, control and clock signals to the memory device through the memory control circuit. In response to an initial address, a read command and the clock signal, the memory device begins to access a first data word at the initial address. The address may be advanced within the memory device in a second access period of the burst access, and a read access of data from a second address occurs. For a latency of two, the first data is driven from the memory device after the second clock signal rising edge of a burst read access occurs. Typically the first data is latched in the microprocessor in response to a third or fourth rising clock edge after an initial column address is latched in the burst access memory. The third clock rising edge also causes the second data value to be driven from the memory device. If BC is low after the initial column address is latched, the third clock rising edge will also cause a third address to be generated within the memory device, and a third data access will begin. Data is latched in the microprocessor in response to fourth, fifth and sixth clock signal rising edges. In this manner four data values are received in the microprocessor in response to a single address and a plurality of clock cycles. The microprocessor may provide a second initial burst address to the memory device if BC is driven high. In this case, a second four word burst sequence may be begun while the microprocessor is receiving data from the first four word burst. For write cycles, there is typically no latency. Data for write cycles is provided with each clock signal rising edge in a burst write sequence.

While the present invention has been described with reference to preferred embodiments, numerous modifications and variations of the invention will be apparent to one of skill in the art without departing from the scope of the invention. For example, it is well known that an active high control signal can be replaced with an active low control signal, a rising clock edge can be replaced with a falling clock edge, etc.

What is claimed is:

1. A Synchronous memory device adapted to receive a free running clock input signal, comprising:

a plurality of addressable memory data storage cells arranged in rows and columns;

a row address strobe (RAS) input adapted to receive a RAS signal which enables a row address latch to receive a row address in response to the clock signal;

a byte enable (BE) input adapted to receive a BE signal which enables the burst access memory to output data in a read cycle and to store data in a write cycle, the BE signal also selecting between an access cycle and a refresh cycle;

a column address circuit; and a burst control (BC) input adapted to receive a BC signal, a first state of the BC signal enabling said column address circuit to receive a column address in response to the clock signal such that the memory operates in a non-burst mode where column address are provided externally, and a second state of the BC signal enabling said column address circuit to generate additional column addresses in response to the clock signal such that the memory operates in a burst mode, without a separate column address strobe (CAS) signal in both the first state and the second state.

2. The burst access memory device of claim 1, wherein the BE signal selects between an access cycle and a refresh cycle within one clock period of receipt of the row address.

3. The burst access memory device of claim 1, further having inputs consisting essentially of:

at least one supply input;

at least one ground input;

a write enable input;

a plurality of address inputs; and a plurality of data input/output nodes.

4. A Synchronous memory device comprising:

a plurality of addressable memory data storage cells arranged in rows and columns;

a supply input;

a ground input;

an address input;

a dat input/output; and a plurality of control signal inputs consisting essentially of:

a write enable input;

a byte enable input;

a row address strobe input;

a clock input for a clock signal; and a burst control (BC) input adapted to receive a BC signal, a first state of the BC signal enabling a column address circuit to receive a column address in response to the clock signal such that the memory operates in a non-burst mode where column address are provided externally, and a second state of the BC signal enabling the column address circuit to generate additional column addresses in response to the clock signal such that the memory operates in a burst mode, without a separate column address strobe (CAS) signal in both the first state and the second state.

5. The memory device of claim 4, wherein a byte enable signal received by said byte enable input is operative to select between a refresh cycle and an access cycle of the memory device.

6. The memory device of claim 5, wherein the byte enable signal is further adapted to enable data input and data output of the memory device.

7. An apparatus comprising:

a burst access memory device adapted to receive a free running clock input signal, said burst access memory device comprising:

a plurality of addressable memory data storage cells arranged in rows and columns;

a row address strobe (RAS) input adapted to receive a RAS signal which enables a row address latch to receive a row address in response to the clock signal;

a byte enable (BE) input adapted to receive a BE signal which enables the burst access memory to output data in a read cycle and to store data in a write cycle, the BE signal also selecting between an access cycle and a refresh cycle;

a column address circuit; and a burst control (BC) input adapted to receive a BC signal, a first state of the BC signal enabling said column address circuit to receive a column address in response to the clock signal such that the memory operates in a non-burst mode where column address are provided externally, and a second state of the BC signal enabling said column address circuit to generate additional column addresses in response to the clock signal such that the memory operates in a burst mode, without a separate column address strobe (CAS) signal in both the first state and the second state.

8. The apparatus according to claim 7, further comprising a microprocessor coupled to said burst access memory device.

9. The apparatus according to claim 7, wherein the apparatus is a memory module.

* * * * *